US010931117B2

(12) United States Patent
Shoemaker

(10) Patent No.: US 10,931,117 B2
(45) Date of Patent: Feb. 23, 2021

(54) LANDFILL GAS POWERED DATACENTER

(71) Applicant: Patrick Robert Shoemaker, Annapolis, MD (US)

(72) Inventor: Patrick Robert Shoemaker, Annapolis, MD (US)

(73) Assignee: Patrick Robert Shoemaker, Annapolis, MD (US)

( * ) Notice: Subject to any disclaimer, the term of this patent is extended or adjusted under 35 U.S.C. 154(b) by 93 days.

(21) Appl. No.: 16/114,184

(22) Filed: Aug. 27, 2018

(65) Prior Publication Data

US 2019/0067951 A1 Feb. 28, 2019

Related U.S. Application Data

(60) Provisional application No. 62/551,136, filed on Aug. 28, 2017.

(51) Int. Cl.
| | | |
|---|---|---|
| *H02J 4/00* | (2006.01) | |
| *H05K 7/20* | (2006.01) | |
| *H02K 7/18* | (2006.01) | |
| *H02J 3/38* | (2006.01) | |
| *F02B 63/04* | (2006.01) | |
| *F02B 43/08* | (2006.01) | |

(52) U.S. Cl.
CPC ............... *H02J 4/00* (2013.01); *H02J 3/381* (2013.01); *H02K 7/1815* (2013.01); *H02K 7/1823* (2013.01); *H05K 7/2079* (2013.01); *F02B 43/08* (2013.01); *F02B 63/04* (2013.01)

(58) Field of Classification Search
CPC ..... Y02E 50/30; Y02E 50/343; Y02E 50/346; Y02E 20/12; Y02E 20/14; Y02E 20/16; F02C 9/40; F01K 17/02; F01K 17/025; F01K 17/04; F01K 13/00; F01K 13/003; F01K 13/006; F01K 13/02; C10L 2290/26; H02J 4/00; H02J 3/381; H02J 13/0006; H02J 2300/10; H02J 2310/16; H02K 7/1815; H02K 7/1823; H05K 7/2079; H05K 7/20745; H05K 7/1497; F02B 43/08; F02B 2043/103; F02B 63/04
See application file for complete search history.

(56) References Cited

U.S. PATENT DOCUMENTS

| | | | | |
|---|---|---|---|---|
| 5,816,792 | A * | 10/1998 | Spencer | F23N 1/005 431/90 |
| 6,169,962 | B1 * | 1/2001 | Brookshire | B09B 1/00 702/47 |
| 2005/0200205 | A1 * | 9/2005 | Winn | H02J 9/062 307/64 |

(Continued)

FOREIGN PATENT DOCUMENTS

WO WO-2013/184718 A1 12/2013

*Primary Examiner* — Mark A Laurenzi
*Assistant Examiner* — Xiaoting Hu
(74) *Attorney, Agent, or Firm* — Foley & Lardner LLP

(57) ABSTRACT

Arrangements of the present disclosure relate to a system including a datacenter, having an electrical connection configured to receive electrical power generated from landfill gas, a thermal connection configured to receive thermal energy generated as a byproduct of generating the electrical power from the landfill gas, a datacenter load powered by the electrical power, and a cooling plant configured to cool the datacenter load using the thermal energy.

20 Claims, 10 Drawing Sheets

(56) References Cited

U.S. PATENT DOCUMENTS

| | | | |
|---|---|---|---|
| 2008/0094797 A1* | 4/2008 | Coglitore | H05K 7/1497 361/679.5 |
| 2014/0284935 A1* | 9/2014 | Disbennett | F02D 19/027 290/1 A |
| 2016/0238494 A1* | 8/2016 | Chrin, II | G01N 33/0062 |

* cited by examiner

LANDFILL GAS POWERED DATACENTER

CROSS-REFERENCE TO RELATED PATENT APPLICATION

This application claims priority from U.S. Provisional Application No. 62/551,136, filed on Aug. 28, 2017, which is incorporated herein by reference in its entirety.

BACKGROUND

A conventional power plant (e.g., as described in WO 2013/184718) incurs high operation costs, given that the provisioned fuel is used to power both the load of the datacenter as well as a cooling load. Additionally, fossil fuel-based power plants emit undesirable carbon dioxide to the atmosphere as a byproduct of operation.

SUMMARY

The present disclosure provides a datacenter that is physically co-located with a waste landfill (e.g., a municipal solid waste landfill) supplying gas to power generators associated with the datacenter. Thermal energy produced as a byproduct of converting the landfill gas into electrical power is used to cool the datacenter.

BRIEF DESCRIPTION OF THE FIGURES

Features, aspects, and advantages of the present arrangements will become apparent from the following description and the accompanying examples shown in the drawings, which are briefly described below.

DETAILED DESCRIPTION

Figure 1:
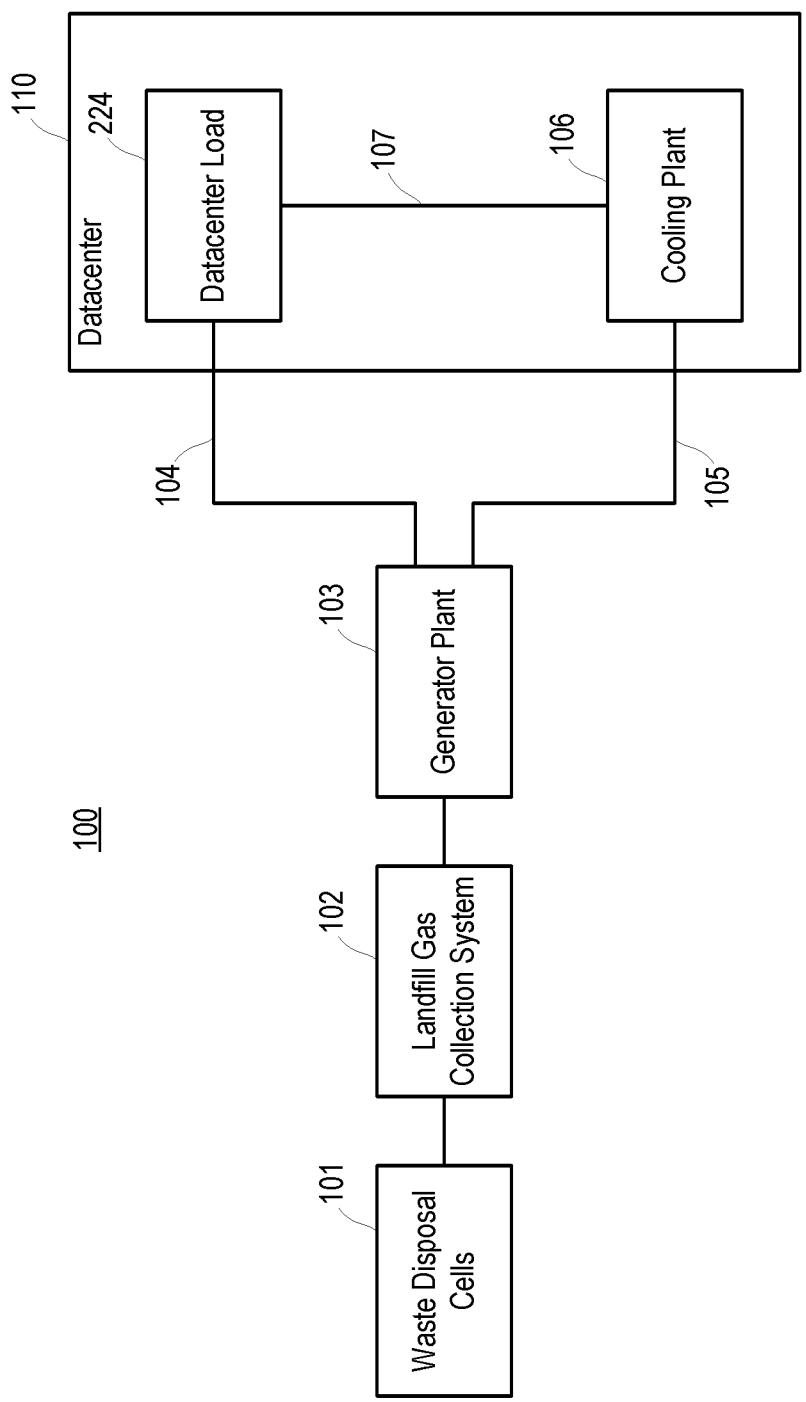
FIG. 1 is a schematic block diagram illustrating an example site layout for a system including a datacenter powered by landfill gas, in accordance with some arrangements.

The detailed description set forth below in connection with the appended drawings is intended as a description of various configurations and is not intended to represent the only configurations in which the concepts described herein may be practiced. The detailed description includes specific details for providing a thorough understanding of various concepts. However, it will be apparent to those skilled in the art that these concepts may be practiced without these specific details. In some instances, well-known structures and components are shown in block diagram form in order to avoid obscuring such concepts.

In the following description of various arrangements, reference is made to the accompanying drawings which form a part hereof and in which are shown, by way of illustration, specific arrangements in which the arrangements may be practiced. It is to be understood that other arrangements may be utilized, and structural changes may be made without departing from the scope of the various arrangements disclosed in the present disclosure.

Arrangements disclosed herein relate to a landfill-gas-to-energy datacenter that is located at, and draws combustible gas fuel directly from, a landfill. The datacenter facility as described herein is physically co-located with the landfill supplying the combustible landfill gas. The landfill gas is collected and inputted to a prime mover, which generates mechanical energy output used to drive a generator and produce electricity. Thermal energy is also produced as a byproduct of combustion, which is transferred into a working fluid using heat exchangers and piped to a datacenter cooling plant. The electrical energy produced by the onsite landfill gas-fueled generators is supplied to the datacenter load. The thermal energy supplied by the landfill gas-fueled generators is piped to the datacenter cooling plant, and is consumed by absorption chillers, which use the heat energy to produce a supply of chilled water for cooling the datacenter load. A backup fuel supply is made available to either the primary prime movers or to a set of secondary prime movers. A control system coordinates usage of landfill gas or backup fuel in order to maintain an uninterrupted supply of electrical and thermal power.

In some examples, a landfill gas, which is a renewable energy source, is configured to serve as an input fuel to satisfy the datacenter load, e.g., during normal operations of the datacenter. In some examples, a chiller load is realized as a result of the datacenter facility cooling demand, which is satisfied using excess thermal energy produced from the landfill gas (e.g., by a landfill gas prime mover) during the normal operations of the datacenter. In some arrangements, the datacenter facility is physically co-located with the landfill supplying the gas.

In some arrangements, a backup fuel source different from the landfill gasses is made available to partially or fully power the datacenter when and responsive to detecting that the landfill gas is unavailable. The landfill gas can be unavailable due to maintenance of landfill-gas-to-energy equipment, collection system failures, or gas production shortfall. In some examples, a control system is implemented to ensure uninterrupted power to the datacenter by coordinating fuel and/or generation sources based on current and predicted fuel availability.

In some arrangements, a process begins with landfill gas, a combustion fuel, which is produced by decaying organic waste stored in a landfill. The landfill gas is collected and moved to a central location using a local piping network. In some examples, the landfill gas is treated to remove impurities. The landfill gas is then used as a fuel input for a prime mover or a set of prime movers, such as but not limited to, reciprocating engine(s), gas turbine engine(s), fuel cell device(s), Rankine Cycle machine(s), a combination thereof, and the like. The prime mover(s) converts the landfill gas into mechanical energy output, for example, through combustion. The mechanical energy output is then used to drive one or more generators, which produce electricity. Thermal energy is also produced by the prime mover(s) as a byproduct of combustion. The thermal energy is transferred to a working fluid, using heat exchangers if necessary. The working fluid (with the thermal energy therein) is piped to a datacenter cooling plant.

In some arrangements, a backup fuel source is provided to supply fuel to the main prime mover(s) (e.g., the prime mover(s) that converts the landfill gas into mechanical energy output when the landfill gas is available) responsive to determining that the landfill gas is unavailable. Examples of the backup fuel source include but are not limited to, natural gas, propane gas, biogas, diesel fuel, kerosene, jet fuel, biodiesel, or another suitable fuel. The backup fuel source can be supplied from a local storage system or by a utility pipeline network. A control system is configured to monitor the current availability of the landfill gas and to introduce the backup fuel from the backup fuel source to the prime mover as needed. In some arrangements, the control system is configured to predict the unavailability of the landfill gas and introduce backup fuel from the backup source as needed.

In some arrangements, a backup fuel source and an additional secondary prime mover (or a set of prime movers) can be provided to supply electrical and thermal energy to the datacenter responsive to determining that the landfill gas is unavailable. Examples of the backup fuel source include but are not limited to, natural gas, propane gas, biogas, diesel fuel, kerosene, jet fuel, biodiesel, or another suitable fuel. Examples of the secondary prime mover(s) include but are not limited to, reciprocating engine(s), gas turbine(s), fuel cell device(s), any combination thereof, and the like designed to accept the backup fuel source. A control system is configured to monitor the current availability of the landfill gas and to adjust an amount of electrical generation from the secondary prime mover and the backup fuel source as needed. In some arrangements, the control system is configured to predict the unavailability of the landfill gas and begin generation using the secondary prime mover(s) and the backup fuel source as needed.

The electrical energy produced from the landfill gas is supplied by the generators to a datacenter load (e.g., an information technology (IT) load) through power conditioning equipment (such as but not limited to, an Alternating Current (AC) switchgear) of the datacenter. The AC switchgear reconfigures electrical power sources and loads connected thereto to ensure continuous power availability to the datacenter load. In some examples, the AC switchgear also has a connection to a local electrical power grid for exporting excess electrical production and/or receiving backup power in the manner described.

The heat energy available in the working fluid supplied by the prime mover is piped to the datacenter cooling plant, and is consumed by absorption chillers that use the heat energy to generate a supply of chilled water. The chilled water supply is used, by a heat exchanger, to absorb heat from hot air generated by the datacenter load and to keep the datacenter air temperature/humidity within operating limits of datacenter equipment (e.g., IT equipment). The chilled water supply can also be used to accept rejected heat from liquid-cooled datacenter equipment. The absorption chillers reject heat collected from the chilled water loop and the heat used in the absorption process to the atmosphere via cooling towers.

FIG. 1 is a schematic block diagram illustrating an example site layout for a system 100 including a datacenter 110 powered by landfill gas, in accordance with some arrangements. Referring to FIG. 1, the system 100 provides continuous power to the datacenter 110. The datacenter 110 has one or more of data storage, processing, and telecommunication capabilities. In that regard, the datacenter 110 includes suitable datacenter equipment (e.g., IT equipment) such as but not limited to, data processing equipment (e.g., processing units), data storage equipment (e.g., volatile memory devices, non-volatile memory devices, and the like), platforms (e.g., racks, pods, and the like), network devices, general servers, and the like. In that regard, the datacenter 110 includes a datacenter load 224 (e.g., a datacenter IT load or a datacenter computer load) corresponding to one or more of the data processing equipment, the data storage equipment, the platforms, the network devices, and the like.

In some arrangements, one or more waste disposal cells 101 of a landfill are containers that hold wastes capable of generating landfill gas. The waste disposal cells 101 feed the landfill gas to a landfill gas collection system 102. The landfill gas collection system 102 includes suitable wells and collection pipes configured to draw the landfill gas from the waste disposal cells 101. At least one generator plant 103 (e.g., a landfill-gas-fired generating plant) utilizes the landfill gas collected by the landfill gas collection system 102 as input to produce electricity. The generator plant 103 relays the electricity to the datacenter load 224 via an electrical connection 104. The electrical connection 104 includes suitable wires and cables configured to pass electrical power.

The generator plant 103 can also produce thermal energy as a byproduct of converting the landfill gas into electricity. In some arrangements, the generator plant 103 also provides the thermal energy to a cooling plant 106 via a thermal connection 105. The thermal connection 105 includes suitable pipes for piping a working fluid carrying the thermal energy to the cooling plant 106. The cooling plant 106 is configured to provide chilled water to the datacenter load 224 via a chilled water loop 107.

As shown in FIG. 1, the datacenter load 224 is physically co-located with the cooling plant 106 and generator plant 103. In some arrangements, the datacenter load 224 (e.g., the data processing equipment, the data storage equipment, the platforms, the network devices, and the like) is located within a same building or within boundaries of a same campus/property as one or more of the generator plant 103, the cooling plant 106, the landfill gas collection system 102, and the waste disposal cells 101. In one example, the generator plant 103, the cooling plant 106, and the datacenter load 224 are located within a same building or structure.

Physical co-location of the datacenter load 224 and one or more of the generator plant 103, the cooling plant 106, the landfill gas collection system 102, and the waste disposal cells 101 physically shortens the electrical connection 104, the thermal connection 105, and the chilled water loop 107, thus improving operational efficiency and stability of the power source.

In some arrangements, the generator plant 103 is physically co-located with the waste disposal cells 101 (e.g., the generator plant 130 is connected with a private, local gas distribution system, not a utility pipeline network, to the landfill gas collection system 102). In some examples, the generator plant 103 and the waste disposal cells 101 are located within boundaries of a same campus/property. Physical co-location in this manner reduces energy loss due to gas compression and pipeline losses, and allows the control system to effectively coordinate datacenter demand with landfill gas supply in the manner described.

Figure 2:
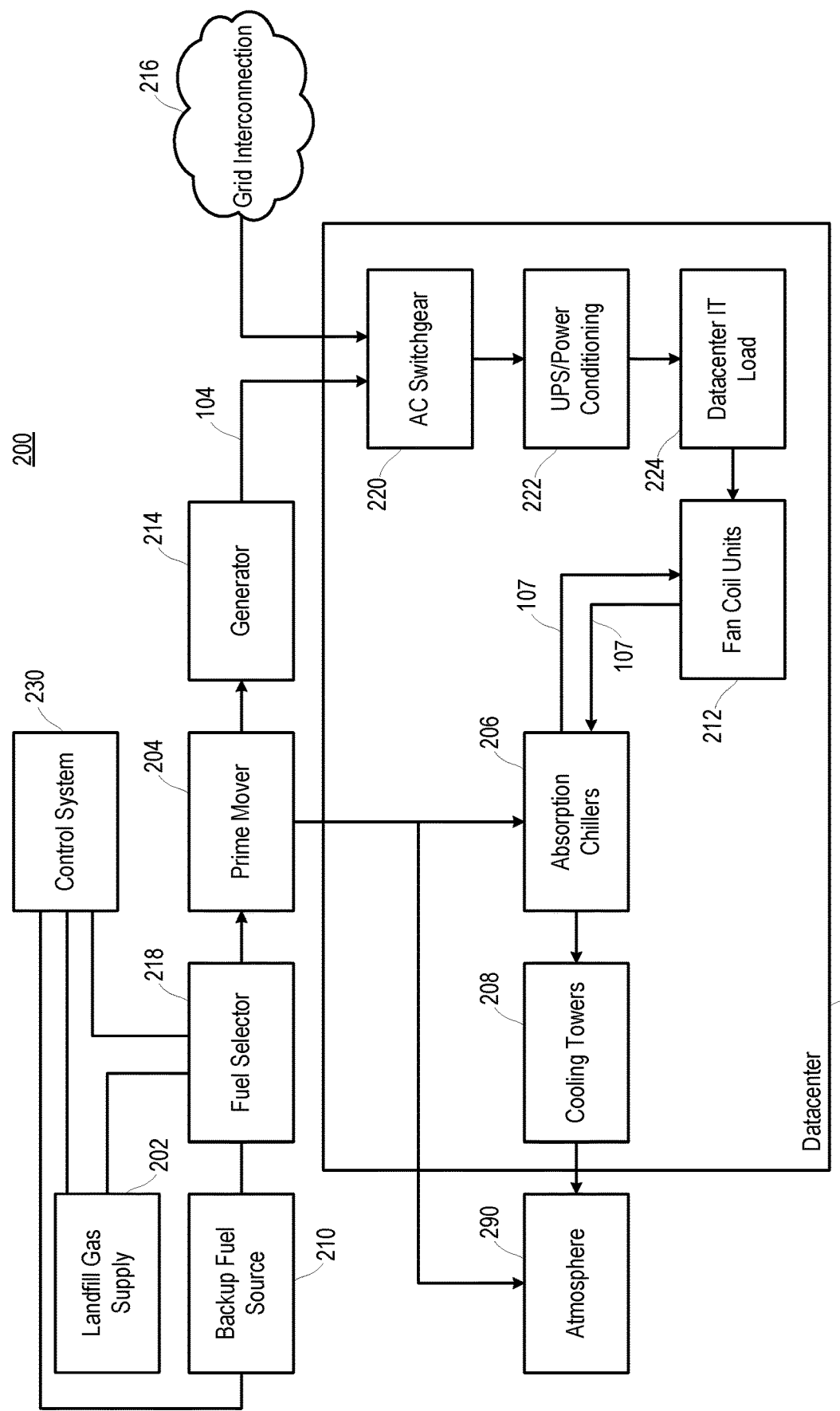
FIG. 2 is a schematic block diagram illustrating an example landfill-gas-powered datacenter, in accordance with some arrangements.

FIG. 2 is a schematic block diagram illustrating an example site layout for a system 200 including the datacenter 110 (FIG. 1) powered by landfill gas, in accordance with some arrangements. Referring to FIGS. 1-2, the system 200 may be an example implementation of the system 100. The system 200 uses using one prime mover or one set of prime movers 204.

As shown in FIG. 2, a landfill gas supply 202 is a source of combustion fuel suitable for use in a reciprocating engine, a gas turbine, a fuel cell, and/or a Rankine Cycle generation process, made available by collecting and processing gases released by municipal solid waste decomposing in a waste disposal cell (e.g., the waste disposal cells 101). In some examples, the landfill gas includes methane (e.g., typically, the landfill gas can include approximately 50% methane), which is a renewable energy source by virtue of its production from decaying landfill waste.

In addition to the landfill gas supply 202, a backup fuel source 210 is provided in order to supply fuel responsive to determining that the landfill gas supply 202 is unavailable. A landfill gas shortage or outage could be caused by, for example, a collection system failure of the landfill gas collection system 102, a change in natural biological processes within the landfill (e.g., within the waste disposal cells 101), loss of anaerobic conditions within the landfill (e.g., within the waste disposal cells 101), a subsurface fire (e.g., in the waste disposal cells 101), or other system fault of one or more of the waste disposal cells 101 and the landfill gas collection system 102, or other equipment. Examples of the backup fuel source 210 include but are not limited to, natural gas, propane gas, biogas, diesel fuel, kerosene, jet fuel, biodiesel, or another suitable fuel. The backup fuel source 210 can be supplied from a local storage system (e.g., co-located within a same building/structure or within boundaries of a campus/property) or by a utility pipeline network.

A fuel selector 218 is used to determine the amount of fuel provided by the landfill gas supply 202 and the backup fuel supply 210. For example, the fuel selector 218 is initiating an action (e.g., selecting the fuels) in response to a command from the control system 230. In some examples, the method of operation of the fuel selector 218 depends on the type of backup fuel source 210 that is available or in use. For example, if the backup fuel supply 210 is natural gas, the fuel selector 218 includes two controllable gas valves. A first valve can control the flow rate of landfill gas supply 202 admitted to the prime mover 204 in response to a command from the control system 230, while a second valve can control the flow rate of natural gas concurrently admitted to the prime mover 204, in response to a command from the control system 230 or according to a mechanical setpoint. In this way, the proportion of primary and backup fuel can be continuously controlled in accordance with commands issued by the control system 230.

The fuel supply (e.g., one of the landfill gas supply 202 and the backup fuel source 210) selected by the selector 218 is fed to a prime mover or set of prime movers (collectively referred to as a prime mover 204). The prime mover 204 includes one or more of reciprocating engine(s), gas turbine(s), fuel cell(s), or Rankine Cycle machine(s) that consumes the selected fuel in order to produce mechanical energy and thermal energy. For example, a reciprocating engine consumes the selected fuel as input, and generates mechanical energy and thermal energy as outputs. The mechanical energy is outputted via an engine shaft of the reciprocating engine. The thermal energy is output from cooling jacket water and exhaust gas as the reciprocating engine is generating the mechanical energy. In another example, a gas turbine consumes the selected fuel as input, and generates mechanical energy and thermal energy as outputs. The mechanical energy is outputted via a gas turbine shaft of the gas turbine. The thermal energy is output from exhaust gas produced by the gas turbine. In yet another example, a Rankine Cycle machine consumes the selected fuel as input, and generates mechanical energy and thermal energy as outputs. The mechanical energy is outputted via a steam turbine shaft of the Rankine Cycle machine. The thermal energy is outputted via low pressure steam and boiler exhaust gas via a heat exchanger of the Rankine Cycle machine. In yet another example, a fuel cell device converts the selected fuel to electrical energy directly, and excess thermal energy is outputted as heat in a working fluid.

In some examples, a control system 230 is configured to control an amount of the landfill gas supply 202 (e.g., the primary supply) and an amount of the backup fuel source 210 (e.g., the backup supply) to be sent to the prime mover. For example, the control system 230 includes a suitable processing circuit having a processor and memory configured to implement the functionalities described herein. The control system 230 monitors various input signals to determine an acceptable rate of consumption of the landfill gas supply 202 by the prime mover 204. The control system 230 then modulates the landfill gas supply 202 and backup fuel source 210 using the fuel selector 218 in order to properly match the consumption of the landfill gas supply 202 with landfill gas availability, while ensuring sufficient fuel availability to the prime mover 204 by introducing the backup fuel source 210 as needed to supplement the landfill gas supply 202. In that regard, the control system 230 is operatively coupled to the fuel selector 218, the landfill gas supply 202 (or sensors coupled thereto), and the backup fuel source 210 (or sensors coupled thereto). Further, the control system 230 is operatively coupled to the prime mover 204 and datacenter load 224, as these components are part of the remainder of the control loop. The control system 230 and the operations thereof are further described with respect to FIG. 5.

Thermal energy from and generated by the prime mover 204 is fed to one or more absorption chillers 206 via a suitable connection (e.g., the thermal connection 105). The absorption chillers 206 are devices that use a heat source (e.g., excess heat from the prime mover 204) to refrigerate a working fluid (e.g., the working fluid in the chilled water loop 107 of the datacenter 110). The absorption chillers 206 use an absorption cooling cycle to remove heat from the working fluid and reject it to the atmosphere 290. The primary energy input for the refrigeration cycle of the absorption chillers 206 is the excess heat from the prime mover 204.

For example, cooling towers 208 are outdoor heat rejection devices that transfer heat from a stream of water to the atmosphere 290. Each of the cooling towers 208 uses either a heat exchanger or a combination of evaporation and convection to directly transfer heat from the water stream to air in the atmosphere 290. The cooling towers 208 are configured to reject heat from the absorption chillers 206.

In some examples, fan coil units 212 can be provided to remove heat from the datacenter load 224 by cooling air within the datacenter 110. Each of the fan coil units 212 may include one or more air-to-water heat exchangers and one or more blowers. Chilled water (e.g., the working fluid) in the chilled water loop 107 (e.g., the refrigeration plant) from the absorption chillers 206 is passed through air-to-water heat exchangers, which is also supplied with air from the datacenter 110 using a blower. Heat is transferred from the air in the datacenter 110 to the chilled water stream in the chilled water loop 107. The water containing the rejected heat is directed via a return path of the chilled water loop 107 to the absorption chillers 206. This lowers the temperature of the air of the datacenter 110 and, in some circumstances, condenses moisture from the air. In that regard, the cooling plant 106 includes the absorption chillers 206, the fan coil units 212, and the cooling towers 208.

As shown, a generator 214 converts the mechanical energy produced by the prime mover 204 to electrical energy for use in the datacenter 110. In some examples, a grid interconnection 216 is an optional electrical connection that integrates or otherwise includes one or more of a datacenter electrical load, the facility's generator electrical output, and a utility power connection. The grid interconnection 216 allows electrical energy to be supplied to, or drawn from, the electrical grid as needed by operating conditions.

An AC switchgear apparatus 220 is electrical equipment that provides fault protection for connected equipment (e.g., the datacenter load 224), and allows for the connection and disconnection of various electrical supplies and loads from common electrical bus(es). The AC switchgear 220 is controlled through both automatic and manual control systems in order to provide protection against unsafe operating conditions, handling of equipment failures, and adjustment to operating conditions. The generator 214 supplies the electricity to the AC switchgear 220 via the electrical connection 104.

UPS/Power conditioning equipment 222 is operatively connected to the AC switchgear 220 to ensure a continuous supply of electrical energy to the datacenter load 224 (e.g., the critical load). The UPS/power conditioning equipment 222 filters, conditions, and stores electrical energy in order to provide continuous, high-quality, electrical power to the datacenter load 224. For example, the UPS/power conditioning equipment 222 is configured to remove voltage spikes and sags, and temporarily provides power for the datacenter load 224 in case of failure of a generation source.

As described, the datacenter load 224 includes equipment housed in the datacenter 110 that provides computing, storage, and network services to users. The datacenter load 224 consumes high-quality electrical power (e.g., received from the UPS/power conditioning equipment 222) and rejects heat to the air in the datacenter 110 as a byproduct of the operations. At least a portion of the rejected heat is collected by fan coil units 212 in the manner described.

Figure 3:
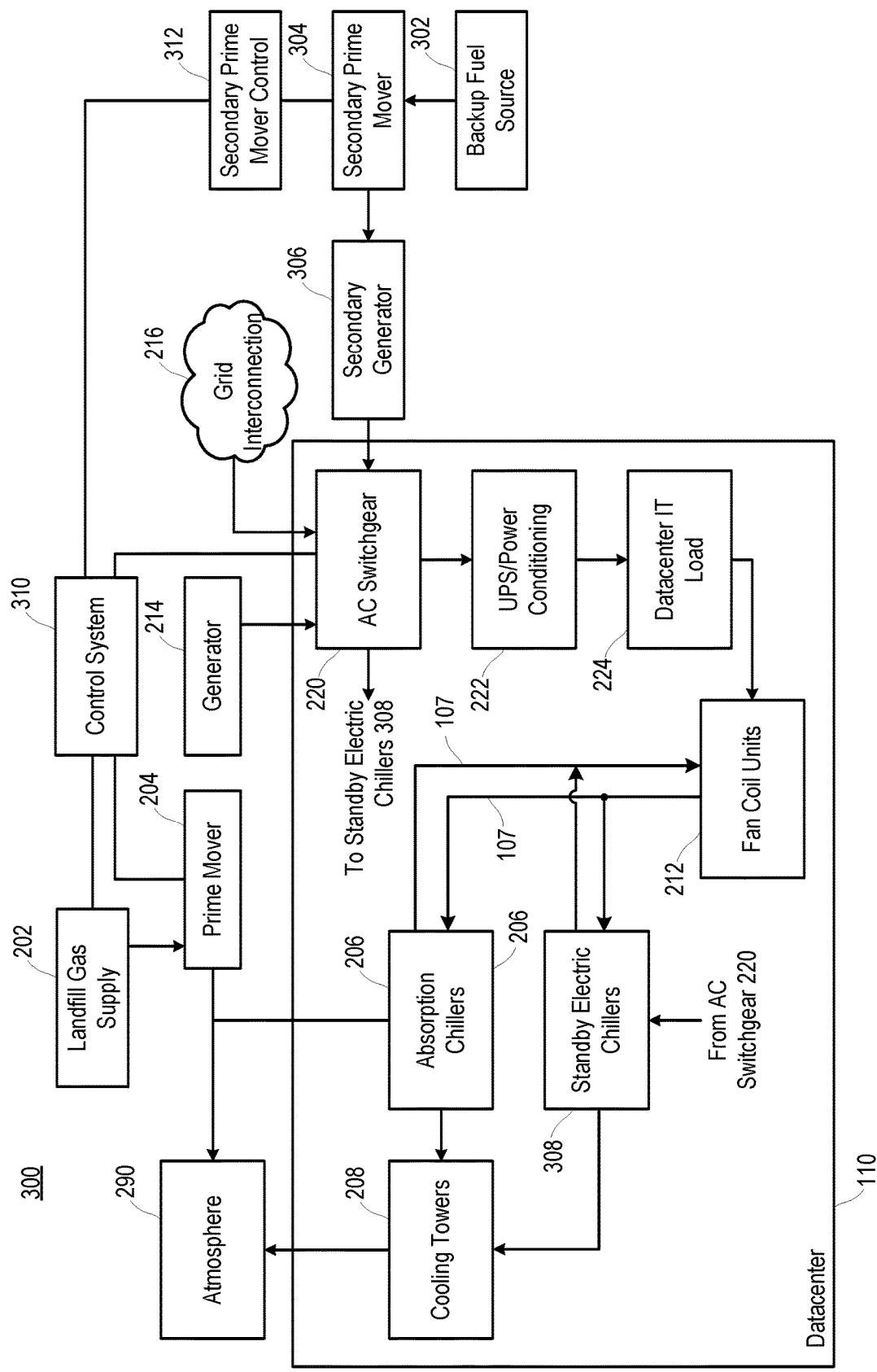
FIG. 3 is a schematic block diagram illustrating an example landfill-gas-powered datacenter, in accordance with some arrangements.

FIG. 3 is a schematic block diagram illustrating an example site layout for a system 300 including the datacenter 110 (FIG. 1) powered by landfill gas, in accordance with some arrangements. Referring to FIGS. 1-3, the system 300 may be an example implementation of the system 100. The system 300 as shown uses two separate prime movers or two separate sets of prime movers 204 and 304, each uses mechanical energy outputted by a different one of the landfill gas supply 202 and a backup fuel source 302.

As shown in FIG. 3, the landfill gas supply 202 is a source of combustion fuel suitable for use in a reciprocating engine, a gas turbine, a fuel cell, and/or a Rankine Cycle generation process, made available by collecting and processing gases released by solid waste decomposing in a waste disposal cell (e.g., the waste disposal cells 101).

The landfill gas supply 202 is fed to a prime mover or set of prime movers (collectively referred to as the prime mover 204). In addition to the landfill gas supply 202, a backup fuel source 302 is provided in order to supply fuel responsive to determining that the landfill gas supply 202 is unavailable. Examples of the backup fuel source 302 include but are not limited to, natural gas, propane gas, biogas, diesel fuel, kerosene, jet fuel, biodiesel, or another suitable fuel. The backup fuel source 302 can be supplied from a local storage system (e.g., co-located within a same building/structure or within boundaries of a campus/property) or by a utility pipeline network.

A secondary prime mover or set of prime movers (collectively referred to as the prime mover 304) uses the backup fuel source 302 as input and outputs mechanical energy and thermal energy. The prime mover 304 includes one or more of reciprocating engine(s), gas turbine(s), fuel cell(s), or Rankine Cycle machine(s) that consumes the backup fuel source 302 in order to produce mechanical energy and thermal energy.

The control system 310 is configured to coordinate selection of the supply of electrical and thermal energy from the prime mover 204 (e.g., the primary supply) and the secondary prime mover 304 (e.g., the backup supply). For example, the control system 310 includes a suitable processing circuit having a processor and memory configured to implemented the functionalities described herein. The control system 310 monitors various input signals to determine an acceptable rate of consumption of the landfill gas supply 202 by the prime mover 204. The control system 310 then provides a signal to a secondary prime mover control 312, in order to properly match the consumption of landfill gas supply 202 with landfill gas availability, while ensuring sufficient fuel availability to the prime mover 204 by introducing the backup fuel source 302 to the secondary prime mover 304 as needed to reduce the load applied to prime mover 204. In that regard, the control system 310 is operatively coupled to the prime mover 204, the landfill gas supply 202 (or sensors coupled thereto), and the secondary prime mover control 312. The control system 310 is further described in FIG. 5.

Thermal energy from and generated by the prime mover 204 is fed to at least one absorption chillers 206 via a suitable connection (e.g., the thermal connection 105). The absorption chillers 206 are devices that use a heat source (e.g., excess heat from the prime mover 204) to refrigerate a working fluid (e.g., the working fluid in the chilled water loop 107 of the datacenter 110), as described. The absorption chillers 206 use an absorption cooling cycle to remove heat from the working fluid and reject it to the atmosphere 290. The primary energy input for the refrigeration cycle of the absorption chillers 206 is the excess heat from the prime mover 204.

As described, the cooling towers 208 are outdoor heat rejection devices that transfer heat from a stream of water to the atmosphere 290. Each of the cooling towers 208 uses either a heat exchanger or a combination of evaporation and convection to directly transfer heat from the water stream to air in the atmosphere 290. The cooling towers 208 are configured to reject heat from the absorption chillers 206.

As described, the fan coil units 212 remove heat from the datacenter load 224 by cooling air within the datacenter 110. Chilled water in the chilled water loop 107 (e.g., the refrigeration plant) from the absorption chillers 206 is passed through an air-to-water heat exchanger, which is also supplied with air from the datacenter 110 using a blower. Heat is transferred from the air in the datacenter 110 to the chilled water stream in the chilled water loop 107. As described, this lowers the temperature of the air of the datacenter 110 and, in some circumstances, condenses moisture from the air.

One or more standby electric chillers 308 are configured to use an electrically-driven vapor-compression refrigeration cycle to refrigerate a working fluid (in this case, the chilled water loop 107 for the datacenter 110. The primary energy input for the refrigeration cycle of the standby electric chillers 308 is electrical energy from electrical bus(es) of the cooling plant 106, where the electrical energy is from, for example, the AC switchgear 220. The electric chillers 308 are used responsive to determining that the absorption chillers 206 are unable to provide sufficient cooling capacity to satisfy the refrigeration needs of the datacenter 110. For example, the absorption chillers 206 are unable to provide sufficient cooling capacity during maintenance periods, if the primary prime mover 204 is unavailable to provide thermal energy, or if the landfill gas supply 202 is disrupted.

In that regard, the cooling plant 106 includes the absorption chillers 206, the cooling towers 208, and the standby electric chillers 308.

The generator 214 converts the mechanical energy produced by the prime mover 204 to electrical energy for use in the datacenter 110 in the manner described. A secondary generator 306 converts the mechanical energy produced by the secondary prime mover 304 to electrical energy for use in the datacenter 110. Optionally, the thermal energy outputted by the secondary generator 306 is likewise routed to the absorption chillers 206 via a suitable thermal connection similar to described with respect to the prime mover 204.

As described, the grid interconnection 216 is an optional electrical connection that integrates the datacenter electrical load, the facility's generator electrical output, and a utility power connection. The grid interconnection 216 allows electrical energy to be supplied to, or drawn from, the electrical grid as needed by operating conditions.

The AC switchgear 220 is electrical equipment that provides fault protection for connected equipment (e.g., the datacenter load 224), and allows for the connection and disconnection of various electrical supplies and loads from common electrical bus(es). The AC switchgear 220 is controlled through both automatic and manual control systems in order to provide protection against unsafe operating conditions, handling of equipment failures, and adjustment to operating conditions. The generator 214, the secondary generator 306, and the gird interconnection 216 provide the electricity of the AC switchgear 220. For example, the generators 214 are connected to the AC switchgear 220 via the electrical connection 104.

The UPS/Power conditioning equipment 222 ensures a continuous supply of electrical energy to the datacenter load 224. The UPS/Power conditioning equipment 222 filters, conditions, and stores the electrical energy in order to provide continuous, high-quality, electrical power to the datacenter load 224. As described, the UPS/Power conditioning equipment 222 removes voltage spikes and sags, and temporarily provides power for the critical load in case of failure of a generation source. The datacenter load 224 includes equipment housed in the datacenter 110 that provides computing, storage, and network services to users.

Figure 4:
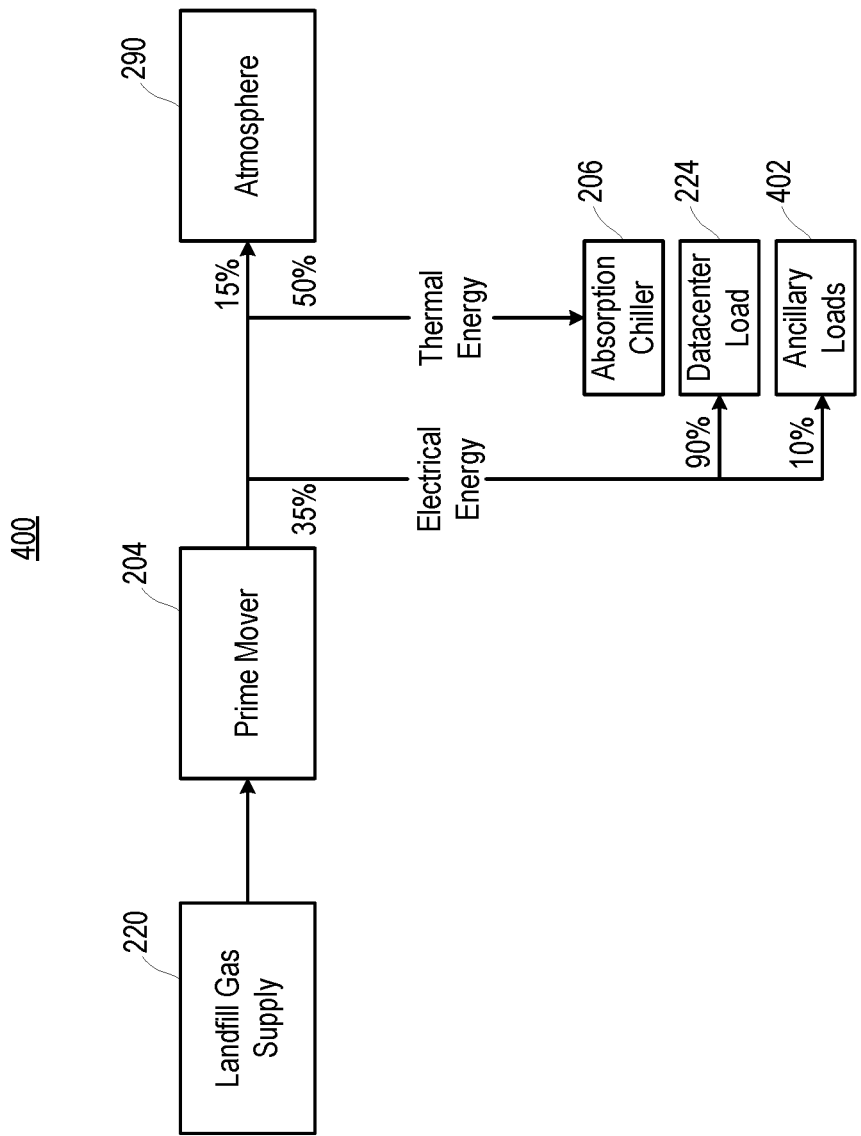
FIG. 4 is an energy flow diagram of a landfill-gas-to-energy datacenter, in accordance with some arrangements.

FIG. 4 is an energy flow diagram of a landfill-gas-to-energy datacenter 400, in accordance with some arrangements. Referring to FIGS. 1-4, the datacenter 400 is a datacenter such as but not limited to, the datacenter 110. In some examples, FIG. 4 shows a manner in which energy flows in the system 200 or 300 during normal operations.

In particular, as shown in FIG. 4, the landfill gas supply 200 (e.g., any landfill gas combustion fuel) is routed locally to the prime mover 204 in the manner described. Heat produced by the prime mover 204 that is unused by other loads is rejected to the atmosphere 290 (e.g., outside of the datacenter 400) as waste heat. In some examples, the waste heat rejected to the atmosphere 290 is approximately 15%.

Electricity (e.g., AC electric power) produced by the generator 214 (not shown in FIG. 4 for brevity) is provided to the datacenter load 224, ancillary systems (e.g., corresponding to ancillary loads 402), and in some cases, exported to the power grid (e.g., via the grid interconnection 216) as electrical energy. The ancillary loads 402 refer to other on-site electrical loads aside from the datacenter load 224 (e.g., the IT equipment load). Examples of the ancillary loads 402 include but are not limited to, pumps, fans, electric chillers, lights, and electronics that are required to support the datacenter facility but are not part of the datacenter load 224. In one example, approximately 35% of the output of the prime mover 204 is electrical energy. In one example, approximately 90% of the electrical energy is being routed to the datacenter load 224 while approximately 10% of the electrical energy is being routed to the ancillary loads 402.

Thermal heat energy produced by the prime mover 204 is provided to the absorption chillers 206 for use in a refrigeration cycle in the manner described. A chiller load is created for the absorption chillers 206 to use of heat energy from the prime mover 204 to power a refrigeration cycle used to chill process water from the datacenter 400. In one example, approximately 50% of the output of the prime mover 204 is thermal energy.

Figure 5A:
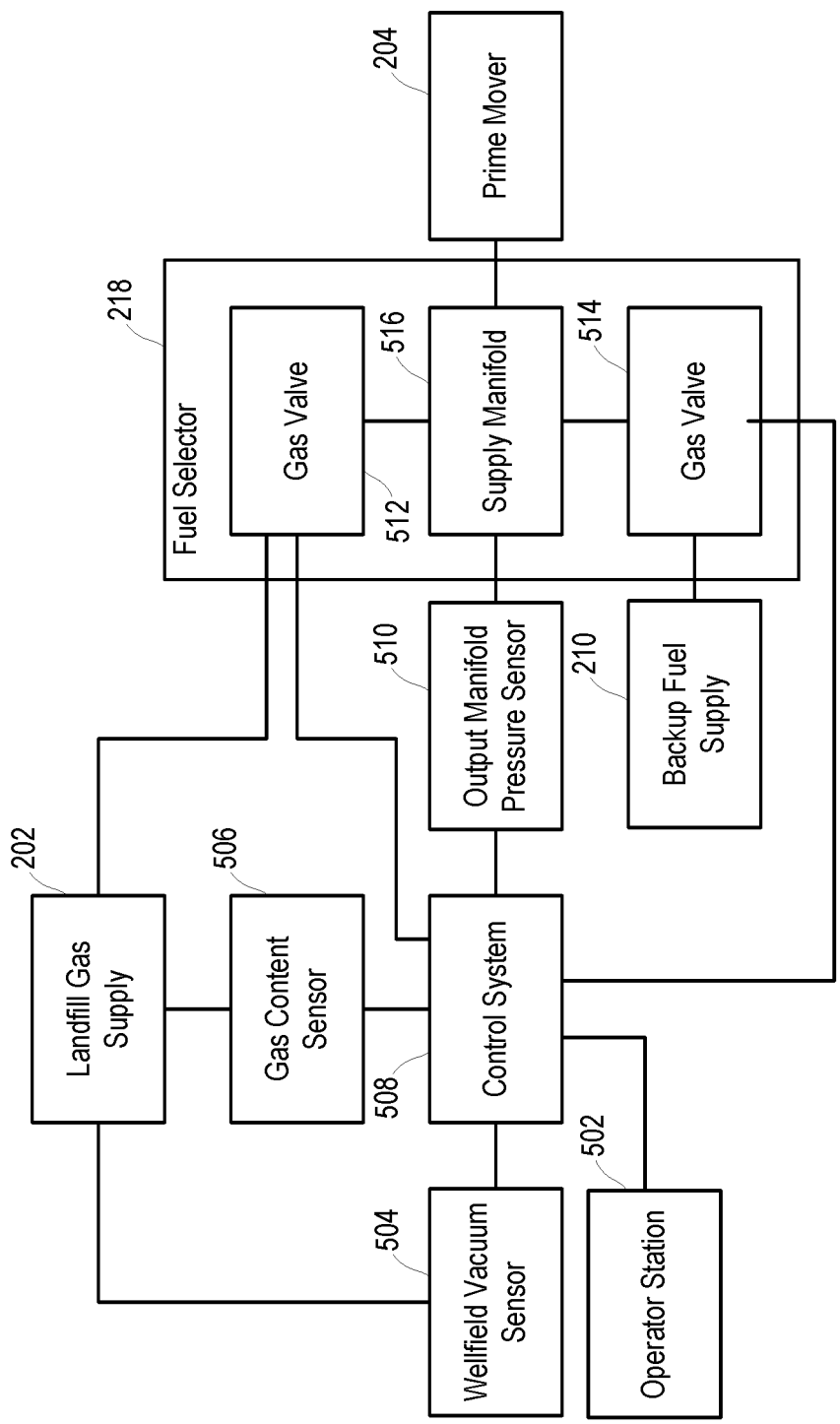
FIG. 5A is a schematic block diagram illustrating an example control system of a landfill-gas-to-energy datacenter, in accordance with some arrangements.
Figure 5B:
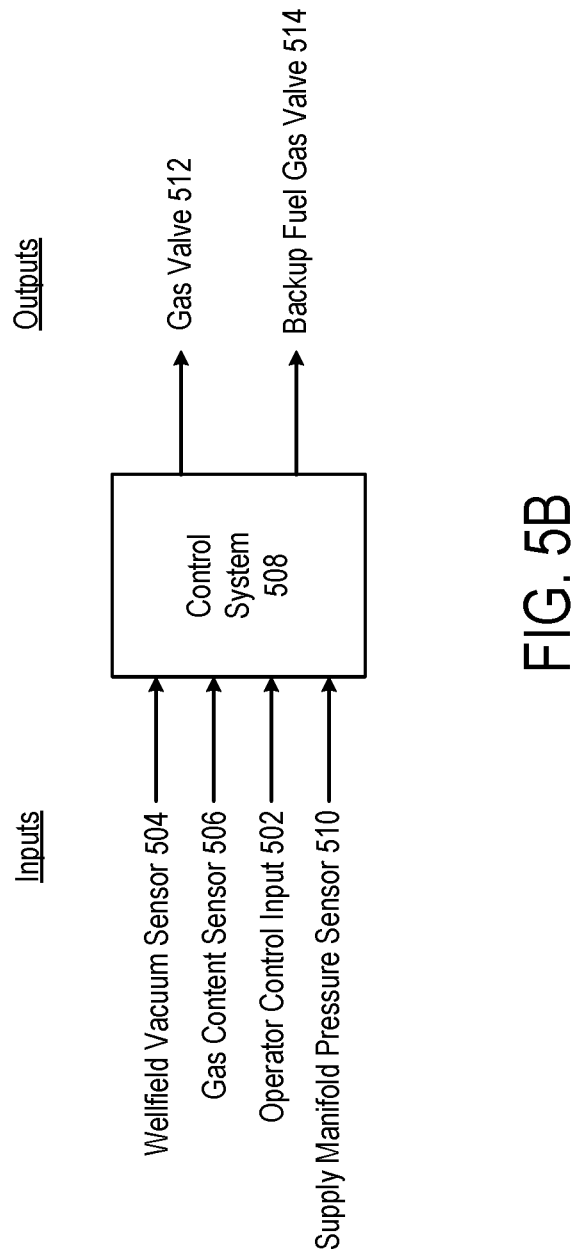
FIG. 5B is an input/output diagram illustrating operations of the control system shown in FIG. 5A, in accordance with some arrangements.

FIG. 5A is a schematic block diagram illustrating an example control system 508 of a landfill-gas-to-energy datacenter, in accordance with some arrangements. FIG. 5B is an input/output diagram illustrating operations of the control system 508 shown in FIG. 5A, in accordance with some arrangements. Referring to FIGS. 1-5B, the control system 508 is configured to control a multi-source electrical generation system of the system 200 in some examples.

As shown, the control system 508 is configured to coordinate the supply of fuel from the primary fuel source (e.g., the landfill gas supply 202) and the secondary fuel source (e.g., the backup fuel supply 210). The control system 508 includes suitable processing capabilities, such as but not limited to, at least one processor and a memory unit.

The control system 508 can determine an amount of the landfill gas supply 202 and an amount of the backup fuel supply 210 to use based on a variety of data or input sources. For example, an operator station 502 (including suitable input device such as but not limited to, a keyboard, mouse, touchscreen, and the like) allows a human operator to provide input regarding landfill gas availability related to the landfill gas supply 202. In some examples, a wellfield vacuum sensor 504 is configured to output a signal indicating the gauge pressure of the landfill gas collection wells (e.g., the wells connected to the waste disposal cells 101), which can be an indicator of landfill gas availability. In some examples, a gas content sensor 506 is configured to determine constituent gas levels of the landfill gas, in particular but not limited to oxygen levels, which can be used as an indicator of landfill gas availability. An output manifold pressure sensor 510 is configured to output a signal to the control system 508 indicative of a pressure of the fuel supplied to the prime mover 204. The pressure of the fuel supplied to the prime mover 204 can be used to actuate individual valve components of the fuel selector in order to maintain a constant pressure in the supply manifold 516.

The control system 508 modulates output gas valve 512 and gas valve 514 to control the amount of landfill gas supply 202 and the amount of backup gas supply 210, respectively, admitted to a supply manifold 516. The supply manifold 516 is operatively connected to the prime mover 204 to supply the fuel to the prime mover 204.

The control system 508 uses the input values from one or more of the inputs 502, 504, and 506 to develop an output decision in order to maintain a constant supply of fuel to the supply manifold 516. During normal operation, the control system 508 admits fuel to the supply manifold 516 solely from the landfill gas source through valve 512. In some examples, responsive to the control system 508 receiving an input from one or more of the inputs 502, 504, and 506 indicating of a current shortage or a likelihood of future shortage of the landfill gas supply 202, the control system 508 begins admitting the backup fuel supply 210 to the supply manifold 516 by controlling the valve 514.

For example, responsive to determining that the gas content sensor 506 has detected an excessive oxygen level (e.g., over a preset threshold value such as but not limited to, 1%) in the landfill gas supply 202, indicating overdraw of the wellfield, the control system 508 proportionally reduces the rate of landfill gas supply 202 delivered to the supply manifold 516 (e.g., to a preset minimum flow rate such as but not limited to 5% if the excessive oxygen level exceeds the preset threshold) and increases the rate of backup fuel supply 210 commensurate with the reduction in rate of the landfill gas supply 202, to offset the landfill gas shortfall, thus correcting the overdraw condition.

For example, responsive to determining that the wellfield vacuum sensor 504 has detected an excessive vacuum level (e.g., over a preset threshold value) in the landfill gas supply 202, indicating overdraw of the wellfield, the control system 508 reduces the rate of landfill gas supply 202 delivered to the supply manifold 516 (e.g., to a preset minimum flow rate if the excessive vacuum level exceeds a threshold) and increases the rate of backup fuel supply 210 commensurate with the reduction in rate of the landfill gas supply 202, to offset the landfill gas shortfall, thus correcting the overdraw condition.

In another example, responsive to the control system 508 receiving user input from the operator station 502 indicating that the landfill gas supply 202 is reduced by a percentage, the control system 508 may reduce the landfill gas supply 202 to the gas valve 512 by a corresponding percentage and open the gas valve 514 as much as needed to supply needed electrical power to the supply manifold 516.

In that regard, the control system 230 may include the control system 508 and one or more of the operator station 502, the well field vacuum sensor 504, the gas content sensor 506, and the output manifold pressure sensor 510.

Figure 6A:
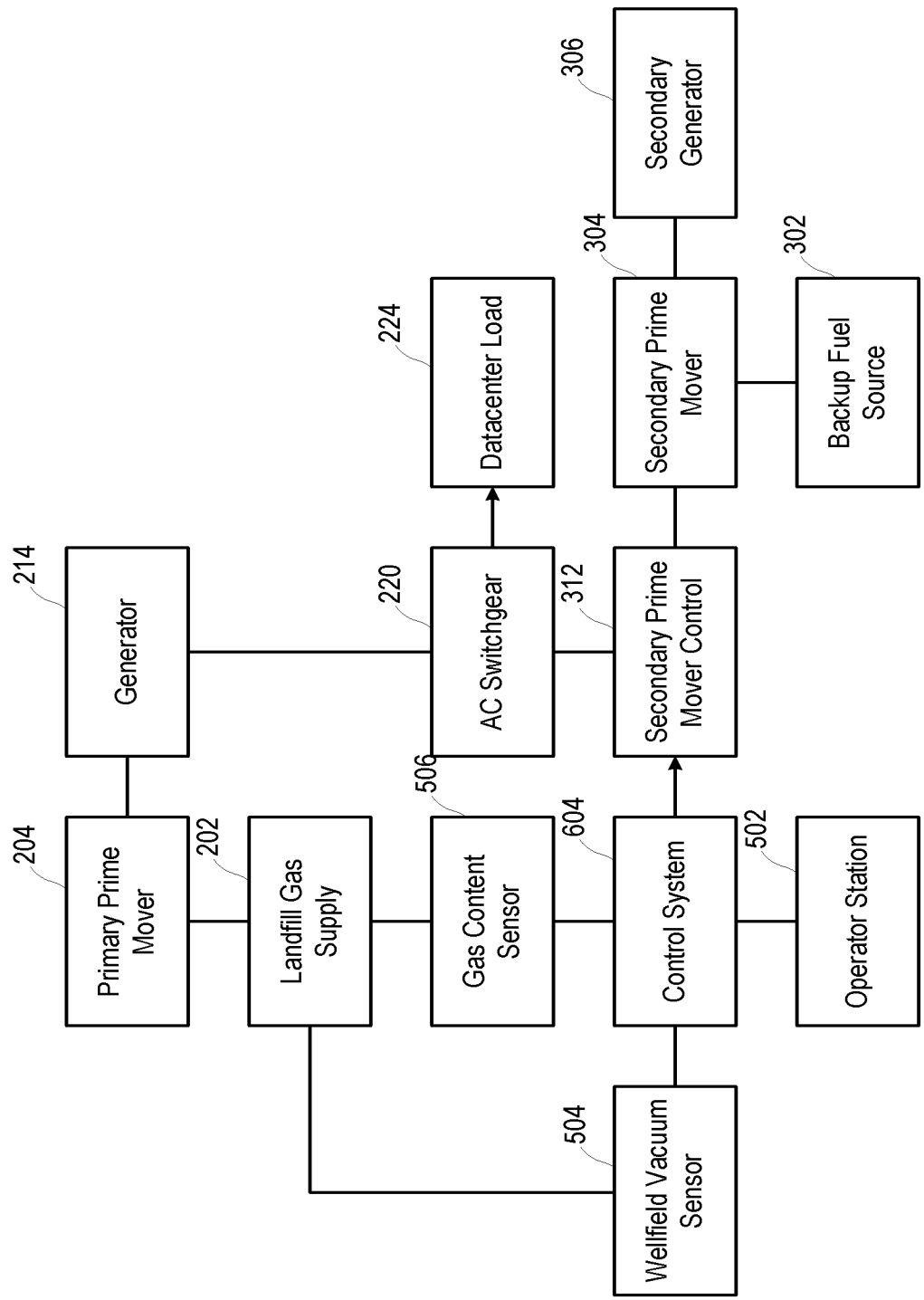
FIG. 6A is a schematic block diagram illustrating an example control system of a landfill-gas-to-energy datacenter, in accordance with some arrangements.
Figure 6B:
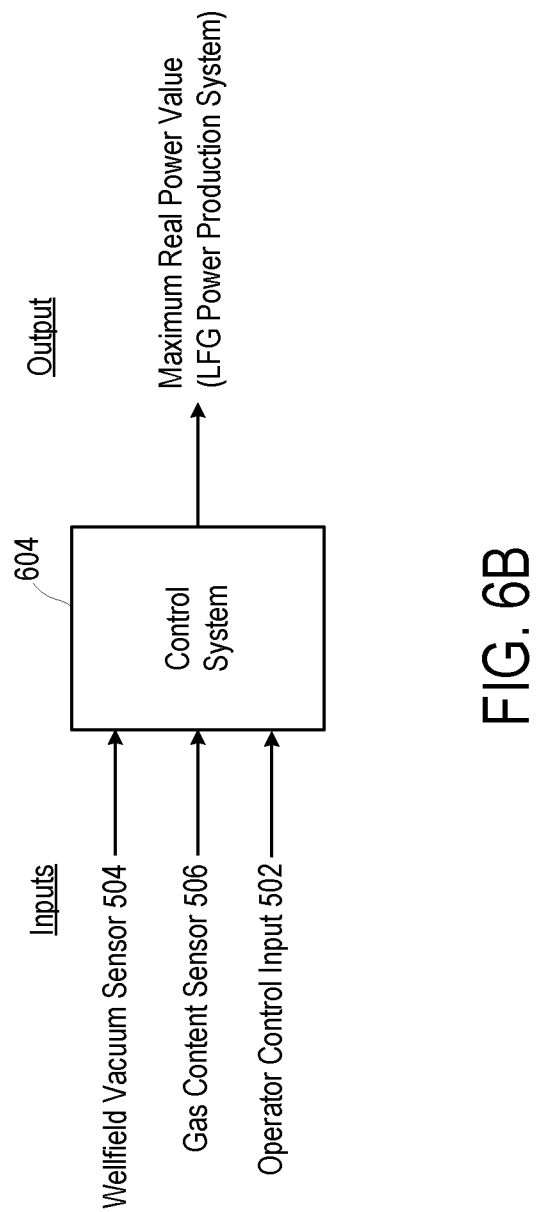
FIG. 6B is an input/output diagram illustrating operations of the control system shown in FIG. 5A, in accordance with some arrangements.

FIG. 6A is a schematic block diagram illustrating an example control system 604 of a landfill-gas-to-energy datacenter, in accordance with some arrangements. FIG. 6B is an input/output diagram illustrating operations of the control system 604 shown in FIG. 6A, in accordance with some arrangements. Referring to FIGS. 1-6B, the control system 604 is configured to control a multi-source electrical generation system of the system 300 in some examples.

As shown, the control system 604 is configured to coordinate the supply of fuel from the primary fuel source (e.g., the landfill gas supply 202) and the secondary fuel source (e.g., the backup fuel source 302). The control system 604 includes suitable processing capabilities, such as but not limited to, at least one processor and a memory unit.

The control system 604 is operatively coupled to and communicates with the secondary prime mover control 312, which is an additional control system that regulates the operation of the secondary prime mover 304. The secondary prime mover control 312 is configured to regulate the amount of real and reactive electrical power supplied to the AC switchgear 220 by the secondary prime mover 304 and the corresponding secondary generator 306.

The control system 604 can determine an amount of the landfill gas supply 202 and an amount of the backup fuel source 302 to use based on a variety of input sources. As described, the operator station 502 allows a human operator to provide input regarding landfill gas availability related to the landfill gas supply 202. The wellfield vacuum sensor 504 is configured to output a signal indicating the gauge pressure of the landfill gas collection wells (e.g., the wells connected to the waste disposal cells 101), which can be an indicator of landfill gas availability. The gas content sensor 506 is configured to determine constituent gas levels of the landfill gas, in particular but not limited to oxygen levels, which can be used as an indicator of landfill gas availability.

The control system 604 uses the input values from one or more of the inputs 502, 504, and 506 to develop an output decision in order to avoid consuming landfill gas from the landfill gas supply 202 at a rate higher than the landfill gas supply 202 can support. For example, as discussed, responsive to determining that the gas content sensor 506 has detected an excessive oxygen level (e.g., over a preset threshold value such as but not limited to, 1%) in the landfill gas supply 202, indicating overdraw of the wellfield, the control system 604 proportionally reduces the rate of consumption of the landfill gas supply 202, thus correcting the overdraw condition.

For example, the control system 604 limits the rate of consumption by the prime mover 204 by issuing a maximum real power delivery value to the secondary prime mover control 312. The maximum real power delivery value specifies the maximum level of real power that can be accepted by the AC switchgear 220 from the landfill gas generator 214 (e.g., from the generator 214). The secondary prime mover control 312 uses the maximum real power delivery value, along with voltage, frequency, and current measurements from the AC switchgear 220 to adjust the real and reactive electrical power values delivered from the secondary generator 306 to the AC switchgear 220 in order to ensure a continuous delivery of power to the datacenter load 224. In an example in which the datacenter load 224 is consuming 2 MW of real power, and the control system 604 specifies a maximum export value of 1.5 MW from the landfill gas generator 214, the secondary prime mover control 312 admits enough of the backup fuel source 302 to cause 0.5 MW of real power to be generated by the secondary generator 306, for example, through modulation of the secondary prime mover 304 throttle assembly.

Figure 7:
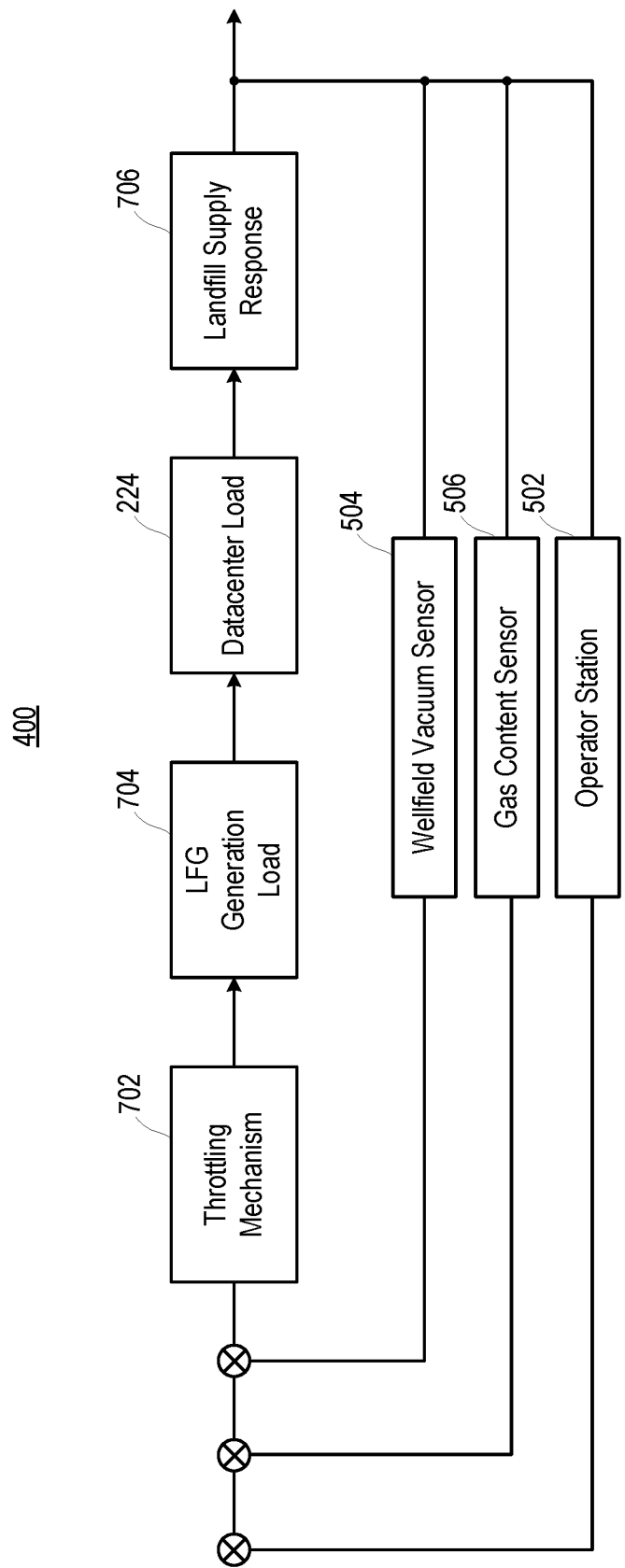
FIG. 7 is a schematic block diagram illustrating a control system, in accordance with some arrangements.

FIG. 7 is a schematic block diagram illustrating a control system 700, in accordance with some arrangements. Referring to FIGS. 1-7, the control system 700 is an example implementation of the control system 230, 310, 508, and 604. The control system 700 is configured to coordinate electrical power requirements of the datacenter load 224, which should be met under any circumstances to assure that the datacenter 110 is operational. As described, unique production characteristics of the landfill may vary based on various environmental and mechanical system characteristics, resulting in unstable output of electrical power. The control system 700 is configured to react to the unavailability or reduced availability of the landfill gas supply 202 by introducing electrical generation capacity from the secondary fuel source (e.g., the backup fuel sources 210 and 302, thus reducing the demand for the landfill gas supply 202. The control system 700 is configured to closely coordinate the unique high-availability requirements of the datacenter load 224 with the unique variable availability of the landfill gas supply 202.

For example, the control system 700 uses the gas content sensor 506 (e.g., an oxygen content sensor) to measure the amount of one or more gases (e.g., oxygen) present in the landfill gas supply 202. If the gas (e.g., oxygen) is present in the landfill gas supply 202 from the wellfield above a predetermined threshold value, the control system 700 determines that landfill gas is being extracted from the landfill (e.g., the waste disposal cells 101) at a higher rate than the bio-processes within the landfill are producing new gas, leading to air intrusion from outside the landfill. This indicates that the landfill gas extraction rate should be decreased.

Likewise, the control system 700 is configured to pre-emptively reduce the extraction rate of landfill gas before air intrusion occurs in the landfill. For example, the wellfield vacuum sensor 504 is configured to measure the pressure at the gas extraction point from the waste disposal cells 101. Responsive to determining that the pressure is below a predetermined threshold value, the control system 700 determines that the gas is being extracted from the landfill at a higher rate than the bio-processes within the landfill are producing new gas. This indicates that the landfill gas extraction rate should be decreased.

In addition, maintenance activities and failures within the landfill gas collection system 102 occasionally reduce the amount of landfill gas that can be extracted from the landfill. The operator station 502 allows the landfill gas collection system operator to inform the control system 700 via user input that landfill gas availability is reduced due to maintenance activities or mechanical failures. This causes the control system 700 to decrease the landfill gas extraction rate.

The control system 700 uses a throttling mechanism 702 to increase or decrease the amount of gas extracted from the landfill gas supply 202. For the system 200, the throttling mechanism 702 corresponds to the fuel selector 218. For the system 300, the throttling mechanism 702 corresponds to the secondary prime mover control 312.

A generation load 704 represents the demand applied to the landfill gas supply 202 for generation of electrical power. For the system 200, the generation load 704 is imposed by the prime mover 204, in proportion to the amount of fuel drawn from each source as commanded by the fuel selector 218. For the system 300, the generation load 704 is imposed by the prime mover 204 exclusively. The generation load 704 can be increased and decreased depending on the demand of the datacenter electrical load 224.

A landfill supply response 706 represents the response of the landfill gas production process to the gas extraction process. This response changes one or more of the inputs 502, 504, 506 to the control system 700, thus forming a control loop.

Figure 8:
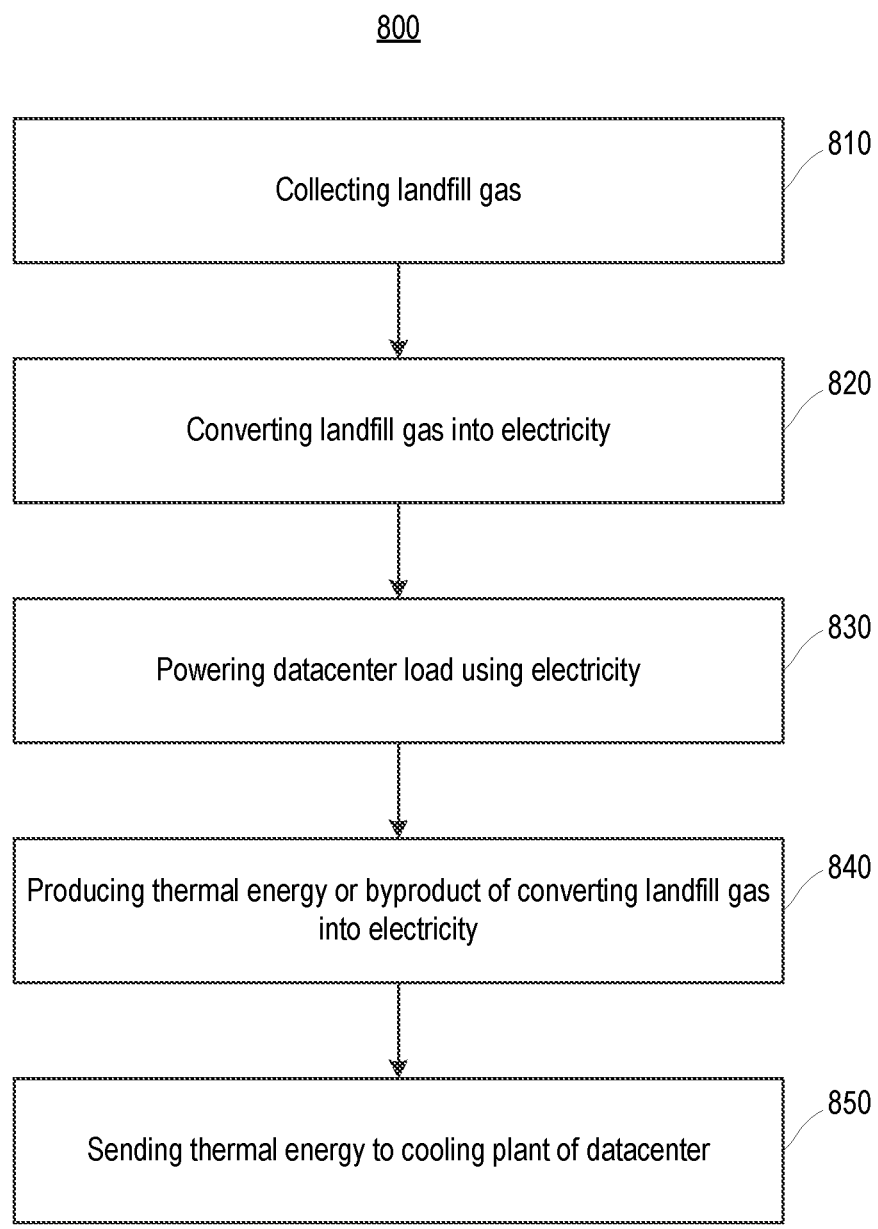
FIG. 8 is a flowchart diagram illustrating a method for powering a datacenter using landfill gas, in accordance with some arrangements.

FIG. 8 is a flowchart diagram illustrating a method 800 for powering the datacenter 110 or 400 using landfill gas, in accordance with some arrangements. Referring to FIGS. 1-8, at 810, the landfill gas collection system 102 collects the landfill gas, for example, from the waste disposal cells 101. At 820, the generator plant 103 (including one or more of the elements 218, 204, 214, 230, 310, 304, 312, 306, 502, 504, 506, and 508) converts the landfill gas into electricity. Converting the landfill gas into the electricity includes at least converting, by the prime mover 204, the landfill gas into mechanical energy output through combustion and producing, by the generator 214, the electricity using the mechanical energy output. The prime mover 204 produces the thermal energy as a byproduct of the combustion. The datacenter power load 224 is powered using the electricity in the manner described, at 830. At 840, the generator plant 103 produces thermal energy as a byproduct of converting the landfill gas into the electricity. At 850, the thermal energy is sent to the cooling plant 106 of to cool the datacenter 110 or 400. Sending the thermal energy to the cooling plant 106 includes transferring the thermal energy to a working fluid using one or more heat exchanges, and piping the working fluid to the cooling plant 106.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA, a programmable logic controller (PLC), or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storages, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A system, comprising:
   a datacenter, wherein the datacenter comprises:
      an electrical connection configured to receive electrical power generated from landfill gas;
      a thermal connection configured to receive thermal energy generated as a byproduct of generating the electrical power from the landfill gas;
      a datacenter load powered by the electrical power; and
      a cooling plant configured to cool the datacenter load using the thermal energy;
   a control system configured to:
      determine availability of the landfill gas based on a constituent gas level of a constituent gas in the landfill gas detected by a gas content sensor;
      determine whether the landfill gas is being extracted at a rate higher than a rate of bio-processes within the landfill are producing the landfill gas based on the constituent gas level;
      control an amount of the landfill gas and an amount of a backup fuel needed based on the constituent gas level;
      limit maximum level of the electrical power generated from the landfill gas that is accepted by the datacenter load, wherein the datacenter load consumes a sum of the maximum level of the electrical power generated from the landfill gas and electrical power generated from the backup fuel, the limit maximum level being less than the sum.

2. The system of claim 1, wherein the cooling plant comprises one or more absorption chillers, one or more fan coil units, and one or more cooling towers.

3. The system of claim 2, wherein the one or more absorption chillers use the thermal energy to refrigerate a working fluid in a chilled water loop of the datacenter.

4. The system of claim 3, wherein
   each of the one or more fan coil units comprises one or more air-to-water heat exchangers and one or more blowers; and
   the working fluid in the chilled water loop is passed through the one or more air-to-water heat exchangers supplied with air from the datacenter using the one or more blowers.

5. The system of claim 1, wherein
   the datacenter further comprises an ancillary load;
   the ancillary load comprises at least one of pumps, fans, electric chillers, and lights; and
   the ancillary load is powered by the electrical power.

6. The system of claim 1, further comprising a prime mover configured to convert the landfill gas into mechanical energy and the thermal energy through combustion, wherein the thermal connection is operatively coupled to the prime mover.

7. The system of claim 6, further comprising a generator configured to convert the mechanical energy into the electrical power.

8. The system of claim 1, further comprising a prime mover, wherein the control system is configured to control the amount of the landfill gas and the amount of the backup fuel sent to the prime mover.

9. The system of claim 8, wherein the control system is operatively coupled to a first gas valve to control the amount of the landfill gas sent to the prime mover and to a second gas valve to control the amount of the backup fuel sent to the prime mover.

10. The system of claim 8, wherein the control system is configured to control the amount of the landfill gas and the amount of the backup fuel sent to the prime mover based on availability of the landfill gas.

11. The system of claim 10, wherein the control system is configured to determine the availability of the landfill gas further based on data received from one or more of an operator station and a wellfield vacuum sensor.

12. The system of claim 11, wherein
the operator station is configured to receive user input regarding the availability of the landfill gas; or
the wellfield vacuum sensor is configured to output a signal indicating a pressure of landfill gas collection wells drawing the landfill gas.

13. The system of claim 1, further comprising:
a first prime mover for the landfill gas;
a second prime mover for a backup fuel;
wherein the control system is further configured to determine a maximum level of real power generated using the landfill gas that can be accepted by the datacenter.

14. The system of claim 1, wherein the at least one constituent gas comprises oxygen.

15. The system of claim 1, wherein the control system is further configured to:
determine whether the constituent gas level of the constituent gas exceeds a predetermined threshold, and
determine that the landfill gas is becoming less available in response to determining that constituent gas level of the constituent gas exceeds the predetermined threshold.

16. A system, comprising:
a prime mover configured to convert landfill gas into mechanical energy and thermal energy through combustion;
a generator configured to convert the mechanical energy into electrical power, wherein
the generator is further configured to send the electrical power to a datacenter load of a datacenter via an electrical connection; and
the prime mover is further configured to send the thermal energy to a cooling plant of the datacenter; and
a control system configured to:
determine availability of the landfill gas based on a constituent gas level of a constituent gas in the landfill gas detected by a gas content sensor;
determine whether the landfill gas is being extracted at a rate higher than a rate of bio-processes within the landfill are producing the landfill gas based on the constituent gas level;
control an amount of the landfill gas and an amount of a backup fuel needed based on the constituent gas level;
limit maximum level of the electrical power generated from the landfill gas that is accepted by the datacenter load, wherein the datacenter load consumes a sum of the maximum level of the electrical power generated from the landfill gas and electrical power generated from the backup fuel, the limit maximum level being less than the sum.

17. The system of claim 16, wherein the control system is configured to control the amount of the landfill gas and the amount of the backup fuel sent to the prime mover.

18. A method for powering a datacenter, comprising:
collecting, by a landfill gas collection system, landfill gas;
converting the landfill gas into electricity;
powering a datacenter power load of the datacenter using the electricity;
producing thermal energy as a byproduct of converting the landfill gas into the electricity;
sending the thermal energy to a cooling plant of the datacenter;
determining availability of the landfill gas based on a constituent gas level of a constituent gas in the landfill gas detected by a gas content sensor;
determining whether the landfill gas is being extracted at a rate higher than a rate of bio-processes within the landfill are producing the landfill gas based on the constituent gas level;
controlling an amount of the landfill gas and an amount of a backup fuel needed based on the constituent gas level;
limiting maximum level of the electrical power generated from the landfill gas that is accepted by the datacenter load, wherein the datacenter load consumes a sum of the maximum level of the electrical power generated from the landfill gas and electrical power generated from the backup fuel, the limit maximum level being less than the sum.

19. The method of claim 18, wherein converting the landfill gas into the electricity comprises:
converting, by one or more prime movers, the landfill gas into mechanical energy output through combustion; and
producing, by one or more generators, the electricity using the mechanical energy output, wherein the one or more prime movers produce the thermal energy as a byproduct of the combustion.

20. The method of claim 18, wherein sending the thermal energy to the cooling plant of the datacenter comprises:
transferring the thermal energy to a working fluid using one or more heat exchangers; and
piping the working fluid to the cooling plant.

* * * * *